(12) United States Patent
Kwon et al.

(10) Patent No.: US 9,698,088 B2
(45) Date of Patent: Jul. 4, 2017

(54) SEMICONDUCTOR PACKAGES

(71) Applicant: Samsung Electronics Co., Ltd., Suwon-si (KR)

(72) Inventors: Heungkyu Kwon, Seongnam-si (KR); Kang Joon Lee, Yongsin-si (KR); JaeWook Yoo, Suwon-si (KR); Su-Chang Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/135,364

(22) Filed: Apr. 21, 2016

(65) Prior Publication Data
US 2016/0240509 A1    Aug. 18, 2016

Related U.S. Application Data

(63) Continuation of application No. 13/478,613, filed on May 23, 2012, now abandoned.

(30) Foreign Application Priority Data

May 24, 2011 (KR) .................. 10-2011-0048964

(51) Int. Cl.
*H01L 23/498* (2006.01)
*H01L 23/488* (2006.01)
(Continued)

(52) U.S. Cl.
CPC ........ *H01L 23/49811* (2013.01); *H01L 23/16* (2013.01); *H01L 23/18* (2013.01); *H01L 23/3157* (2013.01); *H01L 23/488* (2013.01); *H01L 23/49816* (2013.01); *H01L 23/49838* (2013.01); *H01L 24/13* (2013.01); *H01L 24/14* (2013.01); *H01L 24/17* (2013.01); *H01L 25/0652* (2013.01); *H01L 25/0657* (2013.01);
(Continued)

(58) Field of Classification Search
CPC ......... H01L 23/12; H01L 23/13; H01L 23/16; H01L 23/18; H01L 23/24; H01L 23/488; H01L 23/49811; H01L 23/49816
See application file for complete search history.

(56) References Cited

U.S. PATENT DOCUMENTS 6,333,563 B1 * 12/2001 Jackson ............ H01L 23/49833
257/686
6,337,445 B1 *  1/2002 Abbott .............. H01L 23/49816
174/257

(Continued)

FOREIGN PATENT DOCUMENTS

JP        2002-151532        5/2002
KR     10-2002-0035774      5/2002
(Continued)

*Primary Examiner* — Eduardo A Rodela
(74) *Attorney, Agent, or Firm* — Muir Patent Law, PLLC

(57) ABSTRACT

Semiconductor packages include a first substrate including a central portion and a peripheral portion, at least one first central connection member attached to the central portion of the first substrate, and at least one first peripheral connection member attached to the peripheral portion of the first substrate. The first central connection member includes a first supporter and a first fusion conductive layer surrounding the first supporter.

19 Claims, 17 Drawing Sheets

(51) Int. Cl.
*H01L 23/16* (2006.01)
*H01L 23/18* (2006.01)
*H01L 25/065* (2006.01)
*H01L 25/10* (2006.01)
*H01L 23/00* (2006.01)
*H01L 23/31* (2006.01)
*H01L 23/13* (2006.01)

(52) U.S. Cl.
CPC ............ *H01L 25/105* (2013.01); *H01L 23/13* (2013.01); *H01L 24/16* (2013.01); *H01L 24/73* (2013.01); *H01L 2224/0401* (2013.01); *H01L 2224/0557* (2013.01); *H01L 2224/131* (2013.01); *H01L 2224/1319* (2013.01); *H01L 2224/13025* (2013.01); *H01L 2224/1366* (2013.01); *H01L 2224/1367* (2013.01); *H01L 2224/1368* (2013.01); *H01L 2224/13541* (2013.01); *H01L 2224/13561* (2013.01); *H01L 2224/13583* (2013.01); *H01L 2224/13609* (2013.01); *H01L 2224/13611* (2013.01); *H01L 2224/13616* (2013.01); *H01L 2224/13624* (2013.01); *H01L 2224/13639* (2013.01); *H01L 2224/13644* (2013.01); *H01L 2224/13647* (2013.01); *H01L 2224/13649* (2013.01); *H01L 2224/13655* (2013.01); *H01L 2224/13657* (2013.01); *H01L 2224/13664* (2013.01); *H01L 2224/13666* (2013.01); *H01L 2224/13669* (2013.01); *H01L 2224/13671* (2013.01); *H01L 2224/13672* (2013.01); *H01L 2224/13679* (2013.01); *H01L 2224/13681* (2013.01); *H01L 2224/13684* (2013.01); *H01L 2224/1401* (2013.01); *H01L 2224/1403* (2013.01); *H01L 2224/14135* (2013.01); *H01L 2224/14136* (2013.01); *H01L 2224/14181* (2013.01); *H01L 2224/14505* (2013.01); *H01L 2224/16146* (2013.01); *H01L 2224/16225* (2013.01); *H01L 2224/1703* (2013.01); *H01L 2224/175* (2013.01); *H01L 2224/1712* (2013.01); *H01L 2224/1751* (2013.01); *H01L 2224/17181* (2013.01); *H01L 2224/2919* (2013.01); *H01L 2224/32225* (2013.01); *H01L 2224/48227* (2013.01); *H01L 2224/73204* (2013.01); *H01L 2224/73265* (2013.01); *H01L 2225/06513* (2013.01); *H01L 2225/06517* (2013.01); *H01L 2225/06541* (2013.01); *H01L 2225/06555* (2013.01); *H01L 2225/06565* (2013.01); *H01L 2225/1023* (2013.01); *H01L 2225/1058* (2013.01); *H01L 2225/1082* (2013.01); *H01L 2924/00014* (2013.01); *H01L 2924/15153* (2013.01); *H01L 2924/15156* (2013.01); *H01L 2924/15311* (2013.01); *H01L 2924/15321* (2013.01); *H01L 2924/15787* (2013.01); *H01L 2924/18161* (2013.01); *H01L 2924/3511* (2013.01)

(56) References Cited

U.S. PATENT DOCUMENTS

| | | | |
|---|---|---|---|
| 6,365,978 | B1 | 4/2002 | Ibnadbeljalil et al. |
| 7,038,144 | B2 | 5/2006 | Yasuda et al. |
| 7,145,236 | B2 | 12/2006 | Miura et al. |
| 7,265,045 | B2 | 9/2007 | Lee et al. |
| 7,265,046 | B2 | 9/2007 | Kondo et al. |
| 8,330,277 | B2 * | 12/2012 | Machida ............ H01L 21/4846 257/773 |
| 2001/0004135 | A1 | 6/2001 | Okamura |
| 2003/0202332 | A1 * | 10/2003 | Reinikainen ...... H01L 23/49816 361/767 |
| 2011/0156264 | A1 * | 6/2011 | Machida ............ H01L 21/4846 257/773 |

FOREIGN PATENT DOCUMENTS

| | | |
|---|---|---|
| KR | 10-2005-0026518 | 3/2005 |
| KR | 10-2007-0052043 | 5/2007 |

* cited by examiner

SEMICONDUCTOR PACKAGES

CROSS-REFERENCE TO RELATED APPLICATIONS

This application is a Continuation Application and claims the benefits of priority from U.S. application Ser. No. 13/478,613 filed on May 23, 2012 and from Korean Patent Application No. 10-2011-0048964 filed with the Korea Intellectual Property Office on May 24, 2011, the disclosures of both applications being incorporated by reference herein.

BACKGROUND

1. Technical Field

The present disclosure herein relates to semiconductor packages.

2. Description of Related Art

High performance, high speed and small sized electronic systems have been increasingly demanded with the development of the electronic industry. In response to such a demand, various semiconductor package techniques have been proposed. For example, methods of stacking a plurality of semiconductor chips on a semiconductor substrate to mount them in a single package or methods of stacking a plurality of packages have continued to be developed. However, these methods may have some disadvantages such as that a total thickness of the package increases or adhesive stability between the semiconductor chips (or the packages) degrades. Meanwhile, diverse manners to prevent external moisture or contaminants from being introduced into the package have also been developed to improve the reliability of the semiconductor package.

SUMMARY

Exemplary embodiments of the present general inventive concept are directed to semiconductor packages.

Additional features and utilities of the present general inventive concept will be set forth in part in the description which follows and, in part, will be obvious from the description, or may be learned by practice of the general inventive concept.

In an exemplary embodiment, the semiconductor package comprises a first substrate including a central portion and a peripheral portion, at least one first central connection member attached to the central portion of the first substrate, and at least one first peripheral connection member attached to the peripheral portion of the first substrate. The first central connection member includes a first supporter and a first fusion conductive layer surrounding the first supporter.

In an embodiment, the first peripheral connection member may not include the first supporter.

In an embodiment, the at least one first peripheral connection member may include two or more first peripheral connection members, and a distance between the first central connection member and the first peripheral connection member directly adjacent to each other may be equal to or greater than a distance between the first peripheral connection members directly adjacent to each other.

In an embodiment, the semiconductor package may further include at least one first semiconductor chip mounted on the first substrate. The at least one first central connection member and the at least one first peripheral connection member may be disposed between the first substrate and the first semiconductor chip.

In an embodiment, the semiconductor package may further include at least one first semiconductor chip mounted on the first substrate and a second substrate disposed under the first substrate. The at least one first central connection member and the at least one first peripheral connection member may be disposed between the first substrate and the second substrate.

In an embodiment, the central portion may have a square shape, a circular shape or a cross shape in a plan view.

In an embodiment, the semiconductor package may further include at least one second semiconductor chip mounted on the second substrate, and at least one second central connection member and at least one second peripheral connection member disposed between the second substrate and the second semiconductor chip. The second central connection member may include a second supporter and a second fusion conductive layer surrounding the second supporter.

In an embodiment, the second substrate may include a recessed region. The second semiconductor chip may be disposed in the recessed region.

In an embodiment, a height of the first central connection member may be different from a height of the second central connection member.

In an embodiment, the first supporter may include a polymer material. The first central connection member may further include an adhesive layer between the first supporter and the first fusion conductive layer.

In an embodiment, the first supporter may have a sphere shape, a cylinder shape, a regular hexahedron shape or a hexahedron shape.

In an embodiment, a height of the first central connection member may be equal to a height of the first peripheral connection member.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EXEMPLARY EMBODIMENTS

Figure 1:
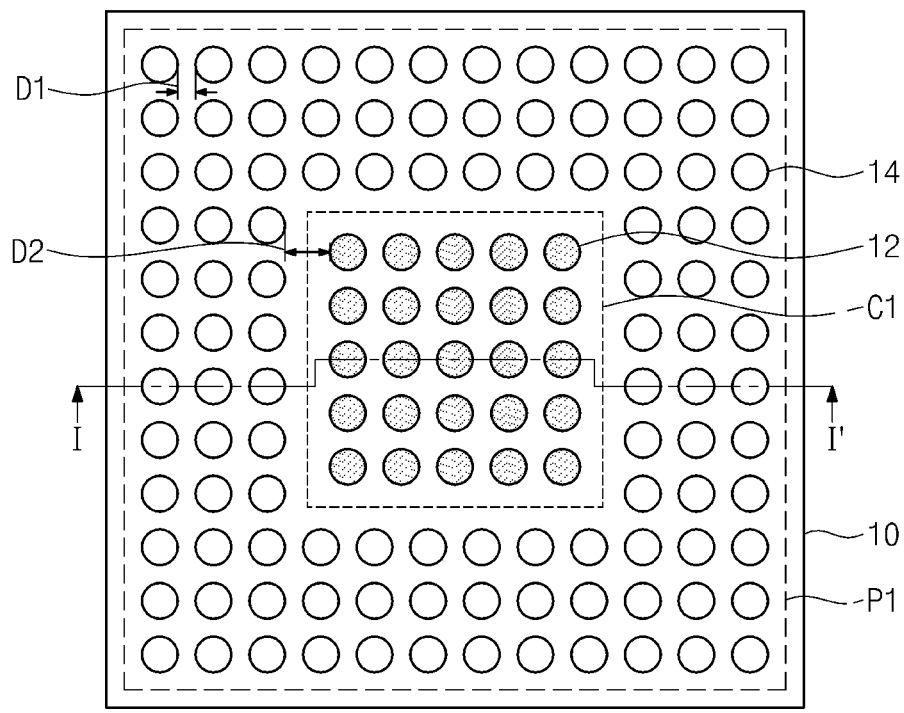
FIG. 1 illustrates a bottom plan view of a semiconductor package according to a first embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention.

Additionally, exemplary embodiments in the detailed description will be described with plan views and sectional views as ideal exemplary views of the inventive concept. Accordingly, shapes of the exemplary views may be modified according to manufacturing techniques and/or allowable errors. Therefore, the exemplary embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

The inventive concept will now be described more fully hereinafter with reference to the accompanying drawings, in which exemplary embodiments of the inventive concept are shown.

Figure 2:
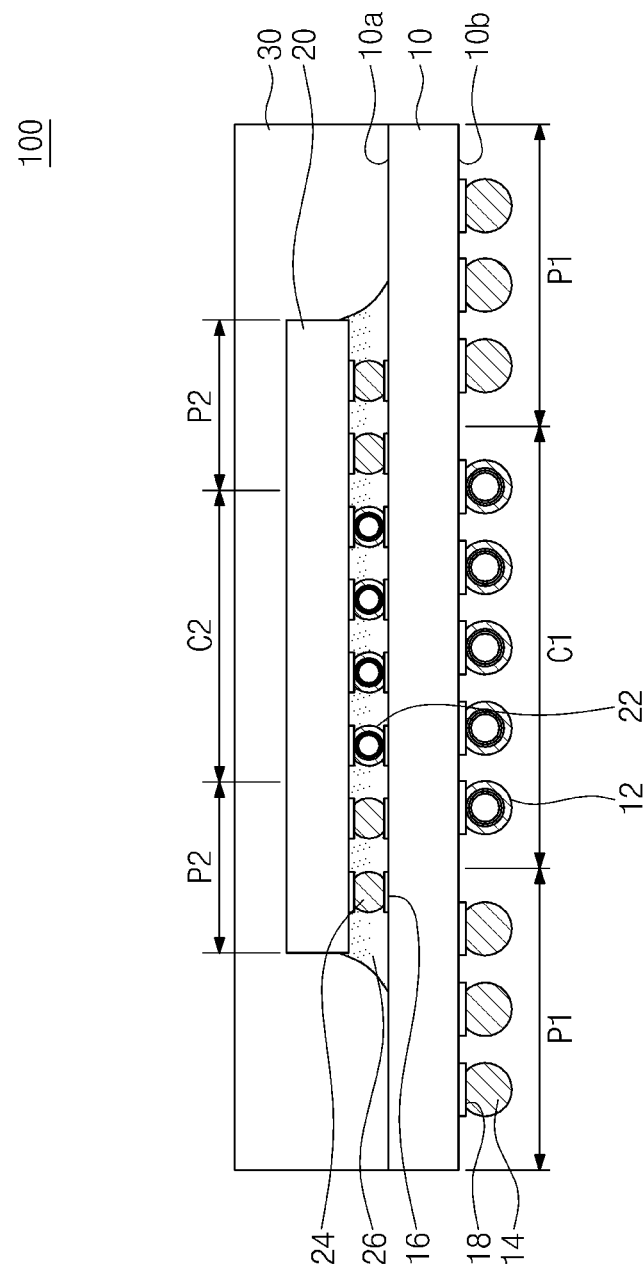
FIG. 2 is a cross sectional view taken along a line I-I' of FIG. 1.
Figure 3:
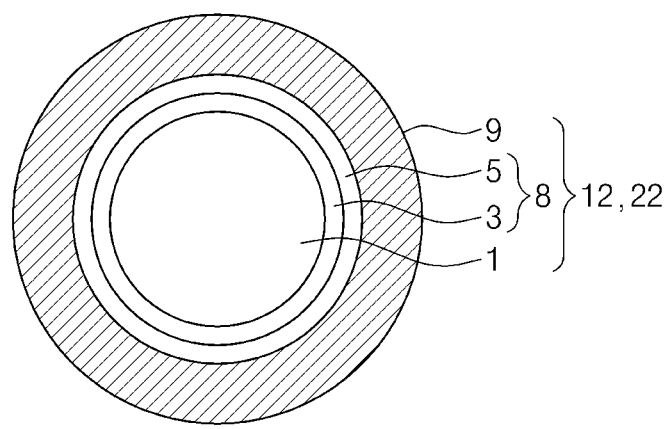
FIG. 3 is an enlarged cross sectional view illustrating an example of central connection members of semiconductor packages according to embodiments of the present general inventive concept.

FIG. 1 illustrates a bottom plan view of a semiconductor package according to an exemplary embodiment of the present general inventive concept, and FIG. 2 is a cross sectional view taken along a line I-I' of FIG. 1. FIG. 3 is an enlarged cross sectional view illustrating an example of central connection members of semiconductor packages according to exemplary embodiments of the inventive concept, and FIG. 4 an enlarged cross sectional view illustrating another example of central connection members of semiconductor packages according to exemplary embodiments of the inventive concept.

Referring to FIGS. 1 and 2, a semiconductor package 100 according to a first embodiment of the inventive concept may include a package substrate 10. The package substrate 10 may include a first central portion C1 and a first peripheral portion P1. In the present exemplary embodiment, the central portion C1 may have a square shape, a circular shape or a cross shape in a plan view. The package substrate 10 may have a top surface 10a and a bottom surface 10b opposite to the top surface 10a. A semiconductor chip 20 may be mounted on the top surface 10a of the package substrate 10 opposite to the bottom surface 10b. The semiconductor chip 20 may include a second central portion C2 and a second peripheral portion P2. The semiconductor chip 20 may be mounted on the top surface 10a so that the second central portion C2 of the semiconductor chip 20 overlaps with the first central portion C1 of the package substrate 10. The package substrate 10 may be a printed circuit board (PCB) or a ceramic substrate. The package substrate 10 may include a semiconductor material or an insulating material. For example, the insulating material used as the package substrate 10 may include bismaleimide triazine resin, alumina type ceramic or glass type ceramic. Upper terminals 16 and lower terminals 19 may be disposed on the top surface 10a and the bottom surface 10b of the package substrate 10, respectively. A plurality of vias may penetrate the package substrate 10. The vias may electrically connect the upper terminals 16 to the lower terminals 18, thereby constitute a circuit.

First connection members 12 and 14 may be disposed on the lower terminals 18 opposite to the bottom surface 10b. The first connection members 12 and 14 may include first peripheral connection members 14 located in the first peripheral portion P1 and first central connection members 12 located in the first central portion C1. A distance between the first central connection members 12 may be equal to a distance D1 between the first peripheral connection members 14. In at least one exemplary embodiment, a distance D2 between the first peripheral connection member 14 and the first central connection member 12, which are directly adjacent to each other, may be preferably greater than the distance D1 between the first peripheral connection members 14. This may increase a design rule relating to an alignment margin in a process of attaching the first connection members 12 and 14 to the bottom surface 10b of the package substrate 10.

Second connection members 22 and 24 may be disposed between the package substrate 10 and the semiconductor chip 20. The second connection members 22 and 24 may include second central connection members 22 disposed under the second central portion C2 and second peripheral connection members 24 disposed under the second peripheral portion P2. The first connection members 12 and 14 may have a different size from the second connection members 22 and 24. In detail, the size of the first connection members 12 and 14 may be greater than the size of the second connection members 22 and 24. That is, a height and a width of the first connection members 12 and 14 may be greater than a height and a width of the second connection members 22 and 24, respectively. As illustrated in FIG. 1, the first peripheral portion P1 may surround the first central portion C1. Similarly, the second peripheral portion P2 may also surround the second central portion C2.

Figure 4:
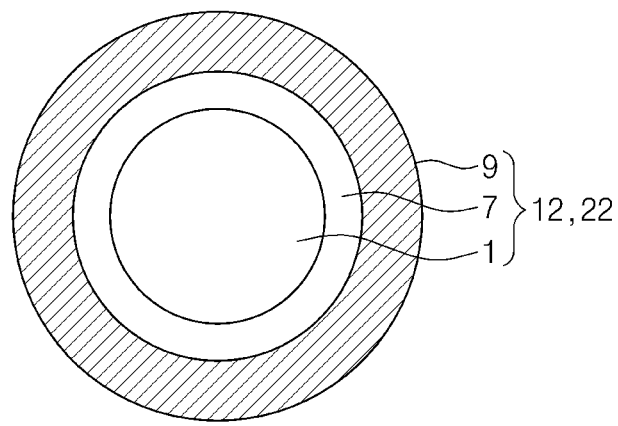
FIG. 4 an enlarged cross sectional view illustrating another example of central connection members of semiconductor packages according to embodiments of the present general inventive concept.

Each of the first and second central connection members 12 and 22 may include a supporter 1, a fusion conductive layer 9 surrounding the supporter 1, and an adhesive/dual adhesive layer 7, 8 disposed between the supporter 1 and the fusion conductive layer 9, as illustrated in FIG. 3 or 4. The supporter 1 may be located at a center area of each of the first and second central connection members 12 and 22, and may have a spherical shape, as illustrated in FIGS. 3 and 4. However, the shape of the supporter 1 is not limited to a sphere. For example, the supporter 1 may have a cylinder shape or a hexahedron shape including a regular hexahedron shape. In the event that the supporter 1 has flat surfaces like the cylinder shape or the hexahedron shape, the flat surfaces of the support 1 may prevent the central connection members 12 and 22 from rolling or leaning during a process of attaching the central connection members 12 and 22 to the top and bottom surfaces 10a and 10b of the package substrate 10. Thus, the process of attaching the central connection members 12 and 22 to the top and bottom surfaces 10a and 10b of the package substrate 10 may be easily performed.

The supporters 1 may be formed of a polymer material. For example, the polymer material used as the supporter 1 may include a polyolefin type material, a polycarbonate type material, a polyester type material, a polyacrylate type material, an epoxy resin or a mixture thereof. However, the polymer material is not limited to the above listed materials. A diameter (or a width) of the supporter 1 may be appropriately controlled by those skilled in the art, and a volume of the fusion conductive layer 9 may be relatively reduced if the diameter of the supporter 1 increases.

Figure 5:
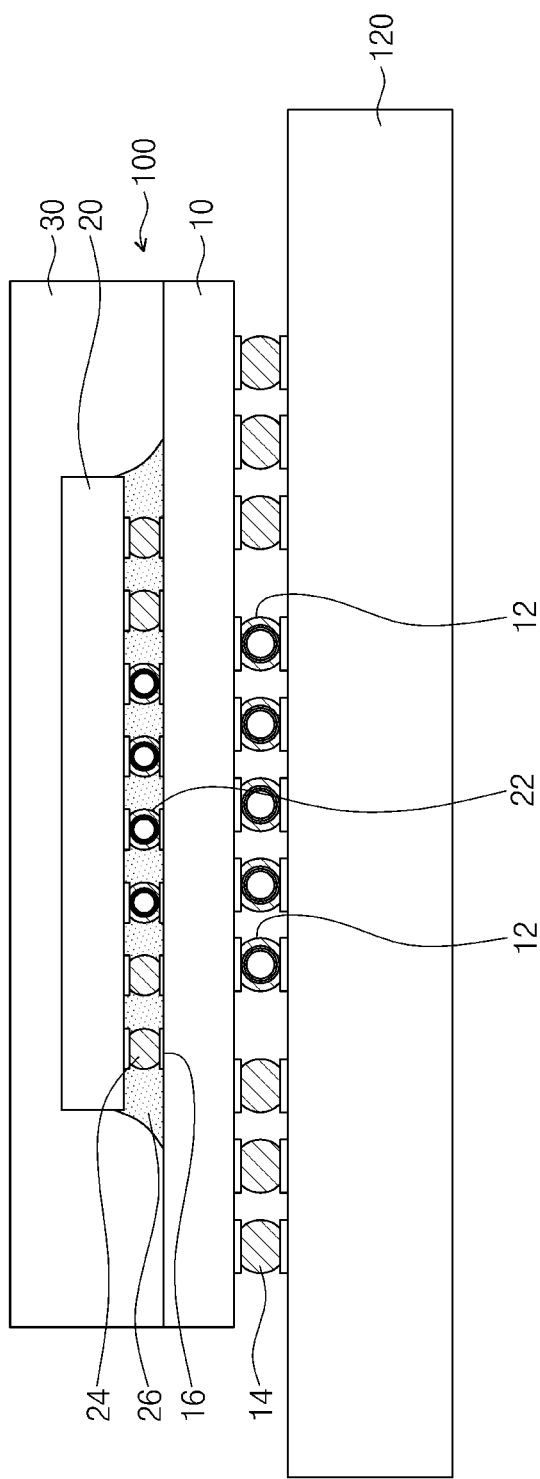
FIG. 5 is a cross sectional view illustrating a motherboard and a semiconductor package of FIG. 2 mounted on the motherboard.

FIG. 5 is a cross sectional view illustrating a mother board 120 and a semiconductor package of FIG. 2 mounted on the mother board 120. Referring to FIGS. 3, 4 and 5, the supporters 1 in the connection members 12, 14, 22 and 24 may act as spacers that maintain a distance between the package substrate 10 and the semiconductor chip 20 as well as a distance between the package substrate 10 and the mother board 120 uniformly.

The fusion conductive layer 9 may electrically connect the package substrate 10 to the semiconductor chip 20, and may physically combine the package substrate 10 with the semiconductor chip 20. The fusion conductive layer 9 may include at least one selected from the group including, but not limited to, an aluminum (Al) material, a titanium (Ti) material, a vanadium (V) material, a chromium (Cr) material, a manganese (Mn) material, an iron (Fe) material, a cobalt (Co) material, a nickel (Ni) material, a copper (Cu) material, a zinc (Zn) material, a zirconium (Zr) material, a niobium (Nb) material, a molybdenum (Mo) material, a palladium (Pd) material, a silver (Ag) material, a cadmium (Cd) material, an indium (In) material, a tin (Sn) material, a tantalum (Ta) material, a tungsten (W) material, a platinum (Pt) material, a gold (Au) material and a lead (Pb) material. In more detail, the fusion conductive layer 9 may include a solder material, for example, an alloy material of a tin (Sn) material and a lead (Pb) material. The connection members 12, 14, 22 and 24 may have a diameter (or a height) of about 100 μm to about 300 μm. In the event that the first connection members 12 and 14 and/or the second connection members 22 and 24 have a diameter (or a height) of about 100 μm to about 300 μm, the package substrate 10 and the semiconductor chip 20 may be sequentially stacked over the mother board 120 with appropriate spaces therebetween. Further, in the event that the first connection members 12 and 14 and/or the second connection members 22 and 24 have a diameter (or a height) of about 100 μm to about 300 μm, adhesive properties among the mother board 120, the package substrate 10 and the semiconductor chip 20 may be enhanced. In this case, the fusion conductive layer 9 may have a thickness of about 10 μm to about 30 μm. In the event that the fusion conductive layer 9 have a thickness of about 10 μm to about 30 μm, the adhesive properties among the mother board 120, the package substrate 10 and the semiconductor chip 20 may be more enhanced. In addition, an electrical shortage between the first connection members 12 and 14 as well as an electrical shortage between the second connection members 22 and 24 may be prevented. A volume of each of the connection members 12, 14, 22 and 24 may be appropriately controlled by adjusting a diameter of the supporters 1 and a thickness of the fusion conductive layers 9.

The adhesive layer may be a double layered material, i.e., a dual adhesive layer 8, including a first adhesive layer 3 and a second adhesive layer 5, as illustrated in FIG. 3. Alternatively, the adhesive layer may be a single adhesive layer 7 of material, as illustrated in FIG. 4. The adhesive/dual adhesive layer 7, 8 plays an important role in adhesion between the fusion conductive layer 9 and the supporter 1. Further, the adhesive/dual adhesive layer 7, 8 may act as a diffusion barrier layer that prevents the atoms in the fusion conductive layer 9 from diffusing into the supporter 1 and vice versa. In the event that the adhesive/dual adhesive layer 7, 8 may be a double layered material as illustrated in FIG. 3, it is preferable that at least one of the first and second adhesive layers 3 and 5 is formed of a material having an excellent thermal stability. That is, even though heat is conducted to the central connection members 12 and 22, the adhesive layer having an excellent thermal stability may prevent the heat from being conducted to the supporter 1 including a polymer material. This is due to the fact that the polymer material may easily be fused if the heat is conducted to the polymer material. The adhesive/dual adhesive layer 7, 8 may include at least one selected from the group including, but not limited to, an aluminum (Al) material, a titanium (Ti) material, a vanadium (V) material, a chromium (Cr) material, a manganese (Mn) material, an iron (Fe) material, a copper (Cu) material, a cobalt (Co) material, a nickel (Ni) material, a zirconium (Zr) material, a niobium (Nb) material, a molybdenum (Mo) material, a palladium (Pd) material, a silver (Ag) material, a cadmium (Cd) material, an indium (In) material, a tin (Sn) material, a tantalum (Ta) material, a tungsten (W) material, a platinum (Pt) material and a gold (Au) material. However, the adhesive/dual adhesive layer 7, 8 may not be limited to the above listed materials. In an exemplary embodiment of the present inventive concept, the first adhesive layer 3 may be a nickel (Ni) layer, and the second adhesive layer 5 may be a copper (Cu) layer.

In an exemplary embodiment, peripheral connection members 14 and 24 may correspond to solder balls consisting of only the fusion conductive layer 9 unlike the central connection members 12 and 22. However, the peripheral connection members 14 and 24 may have a similar outward appearance to the central connection members 12 and 22 or the same outward appearance as the central connection members 12 and 22.

A space region between the semiconductor chip 20 and the package substrate 10 may be filled with an under fill resin layer 26. A top surface and sidewalls of the semiconductor chip 20 as well as a top surface 10a of edges of the package substrate 10 adjacent to the semiconductor chip 20 may be covered with an epoxy type mold layer 30.

The process of manufacturing the semiconductor package 100 illustrated in FIGS. 1 and 2 may be similar to the process of manufacturing a conventional semiconductor package. However, the process of manufacturing the semiconductor package 100 illustrated in FIGS. 1 and 2 is different from the process of manufacturing a conventional semiconductor package in terms of the array of the connection members 12, 14, 22 and 24. That is, when the connection members 12, 14, 22 and 24 are disposed, the first central connection members 12 (or the second central connection members 22) may be disposed in the first central portion C1 (or the second central portion C2) and the first peripheral connection members 14 (or the second peripheral connection members 24) may then be disposed in the first peripheral portion P1 (or the second peripheral portion P2). Alternatively, after the first peripheral connection members 14 (or the second peripheral connection members 24) are disposed in the first peripheral portion P1 (or the second peripheral portion P2), the first central connection members 12 (or the second central connection members 22) may then be disposed in the first central portion C1 (or the second central portion C2).

After disposition of the connection members 12, 14, 22 and 24, the package substrate 10 and/or the semiconductor chip 20 may be heated to a melting point (for example, a temperature exceeding about 240° C.) of the fusion conductive layer 9 in order to melt the fusion conductive layers 9 of the connection members 12, 14, 22 and 24 for a predetermined time and the package substrate 10 and/or the semiconductor chip 20 may be cooled down.

Consequently, the package substrate 10 may be physically combined with the semiconductor chip 20 and the mother board 120 through the connection members 12, 14, 22 and 24. While the package substrate 10 and/or the semiconductor chip 20 are heated to a melting point of the fusion conductive layer 9, central portions C1 and/or C2 of the package substrate 10 and/or the semiconductor chip 20 may be warped to have a concave shape due to a thermal stress. That is, the first central connection members 12 and/or the second central connection members 22 may be pressed down and transformed to decrease a space between the package substrate 10 and the semiconductor chip 20 or a space between the package substrate 10 and the mother board 120. However, according to an exemplary embodiment, each of the central connection members 12 and 22 includes the adhesive layer 7 acting as a thermal blocking layer and the supporter 1. Thus, even though the package substrate 10 and/or the semiconductor chip 20 are heated to a melting point of the fusion conductive layer 9, the supporters 1 may prevent the central connection members 12 and 22 from being deformed. Therefore, the distance between the package substrate 10 and the semiconductor chip 20 (or the distance between the package substrate 10 and the mother board 120) can be uniformly maintained to prevent electrical shortages between the first central connection members 12 (or the second central connection members 22). Consequently, throughput and yield of the semiconductor packages can be improved.

The supporters 1 and the adhesive layers 7 may maintain their initial shapes without any deformation even though the fusion conductive layers 9 melt.

Figure 6:
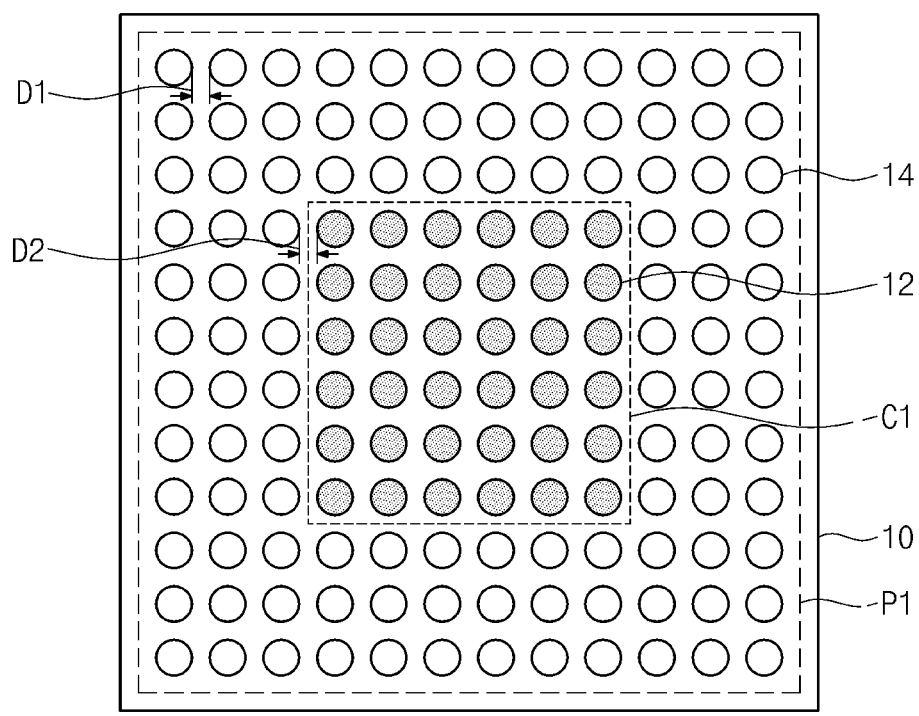
FIG. 6 illustrates a bottom plan view of a semiconductor package according to a second embodiment of the present general inventive concept.

FIG. 6 is a bottom plan view illustrating a package substrate of a semiconductor package according to a second embodiment of the present general inventive concept.

Referring to FIG. 6, first central connection members 12 and first peripheral connection members 14 may be attached to a bottom surface of a package substrate 10, and distances between the first connection members 12 and 14 may be uniform. That is, a distance D2 between the first peripheral connection member 14 and the first central connection member 12, which are directly adjacent to each other, may be equal to a distance D1 between the first peripheral connection members 14. Other configurations except the distances D1 and D2 may be the same as described in the first embodiment.

Figure 7:
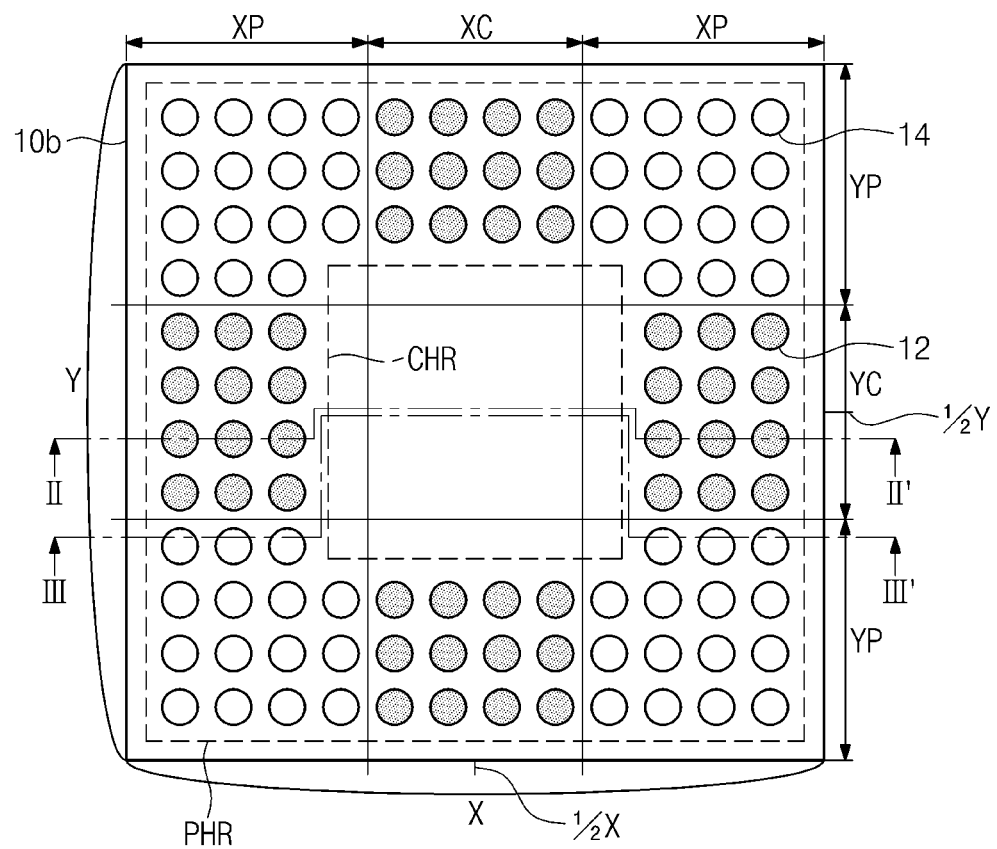
FIG. 7 illustrates a bottom plan view of a semiconductor package according to a third embodiment or a fourth embodiment of the present general inventive concept.
Figure 8A:
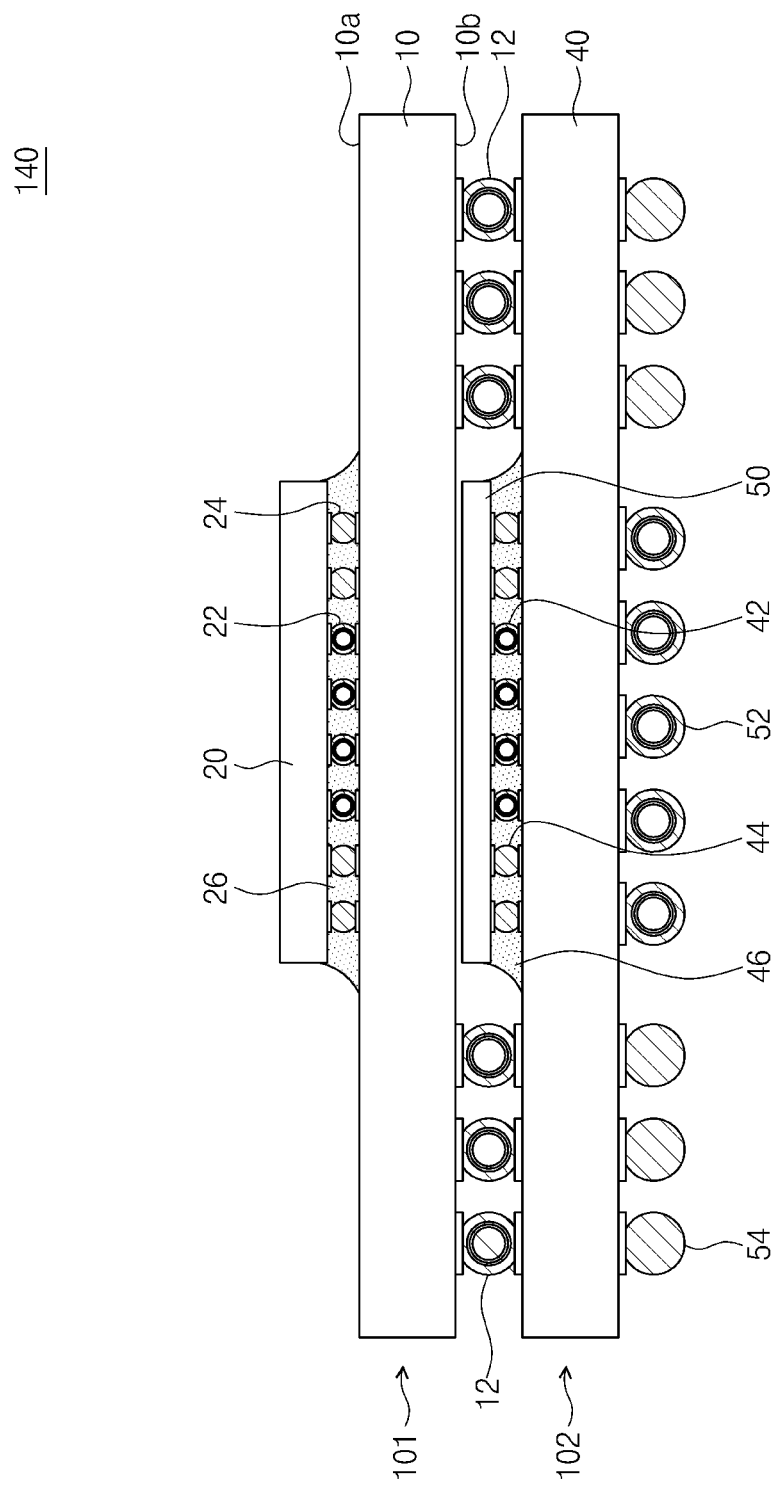
FIGS. 8A and 8B are cross sectional views taken along lines II-II' and III-III' of FIG. 7, respectively, to illustrate a semiconductor package according to a third embodiment of the present general inventive concept.
Figure 8B:
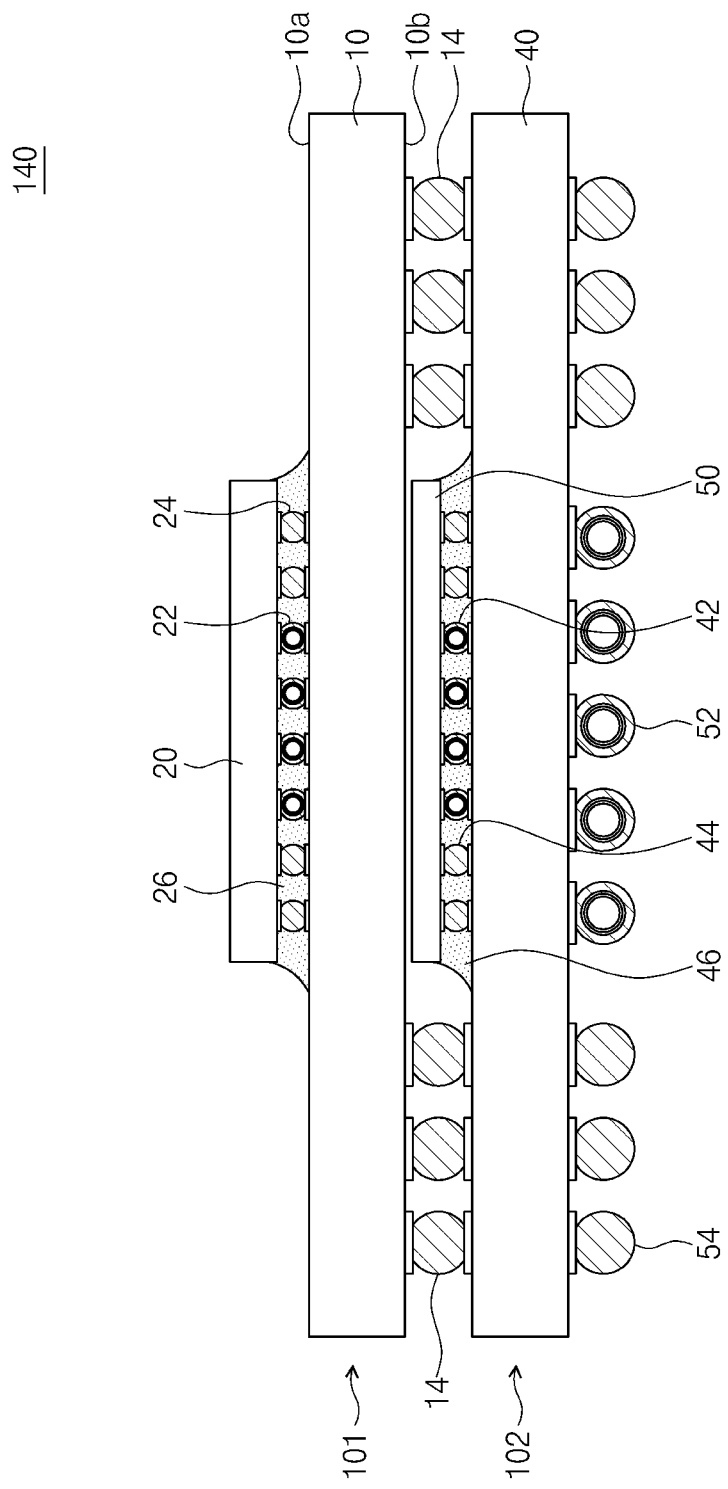

FIG. 7 is a bottom plan view illustrating a package substrate of a semiconductor package according to a third embodiment or a fourth embodiment of the present general inventive concept. FIGS. 8A and 8B are cross sectional views taken along lines II-II' and III-III' of FIG. 7, respectively, to illustrate a semiconductor package according to a third embodiment of the present general inventive concept.

Referring to FIGS. 7, 8A and 8B, a semiconductor package 140 according to the third embodiment of the present general inventive concept may have a package-on-package structure including a first sub semiconductor package 101 and a second sub semiconductor package 102 disposed below the first sub semiconductor package 101. The first sub semiconductor package 101 may include a first package substrate 10 and a first semiconductor chip 20 mounted on a top surface 10a of the first package substrate 10. Second central connection members 22 and second peripheral connection members 24 may be disposed between the first package substrate 10 and the first semiconductor chip 20. The second sub semiconductor package 102 may include a second package substrate 40 and a second semiconductor chip 50 mounted on the second package substrate 40. Third central connection members 42 and third peripheral connection members 44 may be disposed between the second package substrate 40 and the second semiconductor chip 50. Fourth central connection members 52 and fourth peripheral connection members 54 may be disposed on a bottom surface of the second package substrate 40 opposite to the second semiconductor chip 50. First central connection members 12 and first peripheral connection members 14 may be disposed between a bottom surface 10b of the first package substrate 10 and the second package substrate 40. Each of the central connection members 12, 22, 42 and 52 may include a supporter therein.

Referring again to FIG. 7, the bottom surface 10b of the first package substrate 10 may have a rectangular shape including a pair of horizontal sides X and a pair of vertical sides Y. As illustrated in FIGS. 7, 8A and 8B, the second semiconductor chip 50 may be disposed to be adjacent to a central portion CHR of the bottom surface 10b of the first package substrate 10. Thus, none of the first connection members 12 and 14 are disposed on the central portion CHR of the bottom surface 10b of the first package substrate 10. In the present embodiment, the central portion CHR may have a regular square shape in a plan view. The first connection members 12 and 14 may be disposed in a peripheral portion PHR surrounding the central portion CHR. In the bottom surface 10b of the first package substrate 10, the peripheral portion PHR may include a pair of horizontal center portions XC, a pair of vertical center portions YC and four corner regions. In the bottom plan view of FIG. 7, the pair of horizontal center portions XC may be disposed at upper and lower sides of the central portion CHR, respectively. Further, the pair of vertical center portions YC may be disposed at left and right sides of the central portion CHR, respectively. That is, the pair of horizontal center portions XC may be respectively disposed to be adjacent to central points ½X of the pair of horizontal sides X, and the pair of vertical center portions YC may be respectively disposed to be adjacent to central points ½Y of the pair of vertical sides Y. Thus, the pair of horizontal center portions XC, the pair of vertical center portions YC and the central portion CHR may constitute a cross shape.

A pair of first horizontal peripheries XP may be respectively located at both sides of the upper horizontal center portion XC, and a pair of second horizontal peripheries XP may be respectively located at both sides of the lower horizontal center portion XC. Similarly, a pair of first vertical peripheries YP may be respectively located at upper and lower sides of the left vertical center portion YC, and a pair of second vertical peripheries YP may be respectively located at upper and lower sides of the right vertical center portion YC. Thus, the horizontal peripheries XP may overlap with the vertical peripheries YP, respectively. That is, the corner regions of the peripheral portion PHR may correspond to the horizontal peripheries XP (or the vertical peripheries YP), respectively.

The first central connection members 12 may be disposed in the pair of horizontal center portions XC and the pair of vertical center portions YC. That is, the first central connection members 12 may be disposed to be adjacent to four sides of the square shown in a dotted line indicating the central portions CHR. The first peripheral connection members 14 may be disposed in the corner regions XP (or YP). That is, the first peripheral connection members 14 may be disposed to be adjacent to four vertices of the square shown in a dotted line indicating the central portions CHR, as illustrated in FIG. 7.

The first central connection members 12 may prevent the first package substrate 10 from being warped to have a concave shape when the first sub semiconductor package 101 is mounted on the second semiconductor package 102. Further, the distance between the first and second package substrates 10 and 40 may be uniformly maintained because of the presence of the first central connection members 12. Thus, the reliability of the semiconductor package 140 may be improved.

Figure 9A:
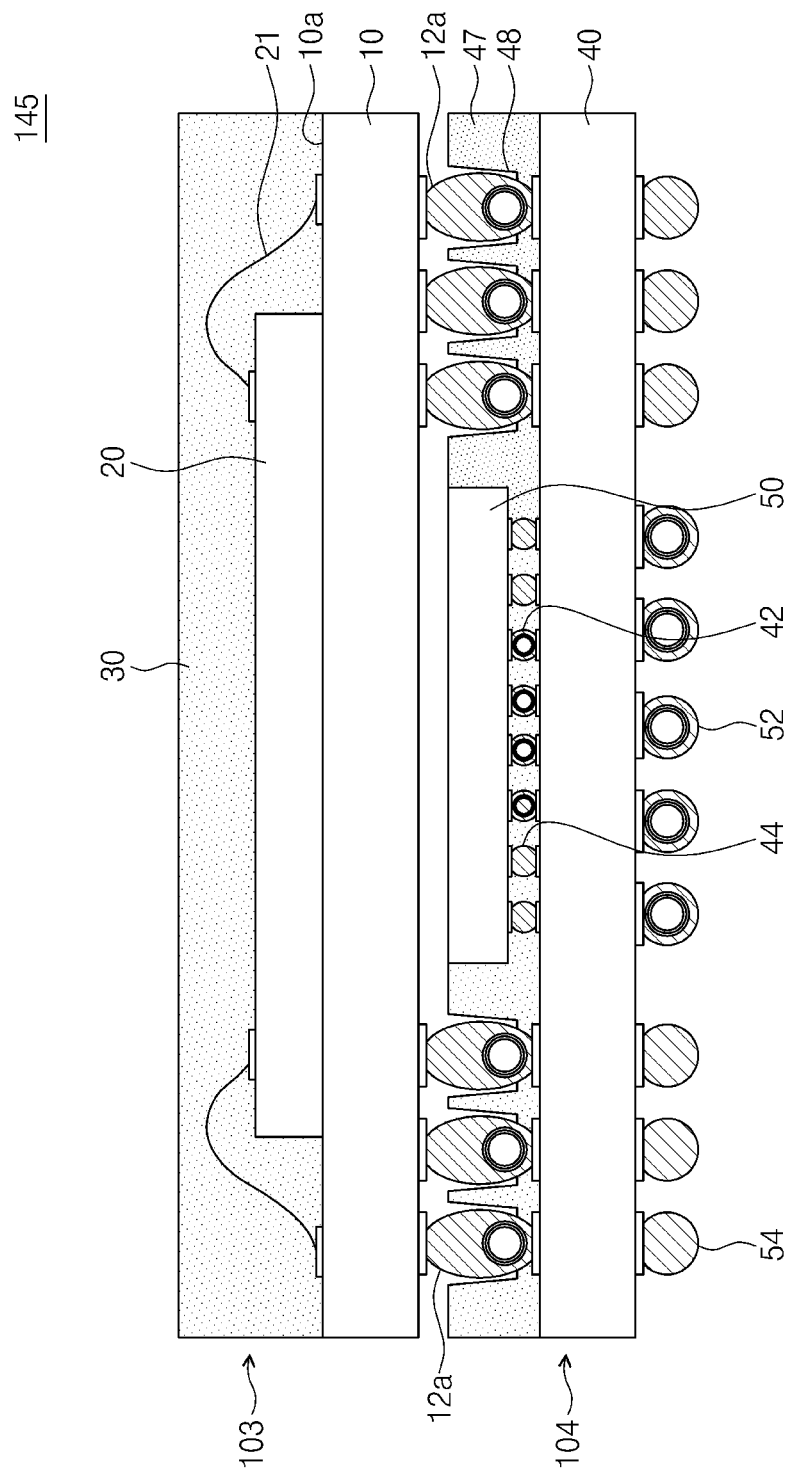
FIGS. 9A and 9B are cross sectional views taken along lines II-II' and III-III' of FIG. 7, respectively, to illustrate a semiconductor package according to a fourth embodiment of the present general inventive concept.
Figure 9B:
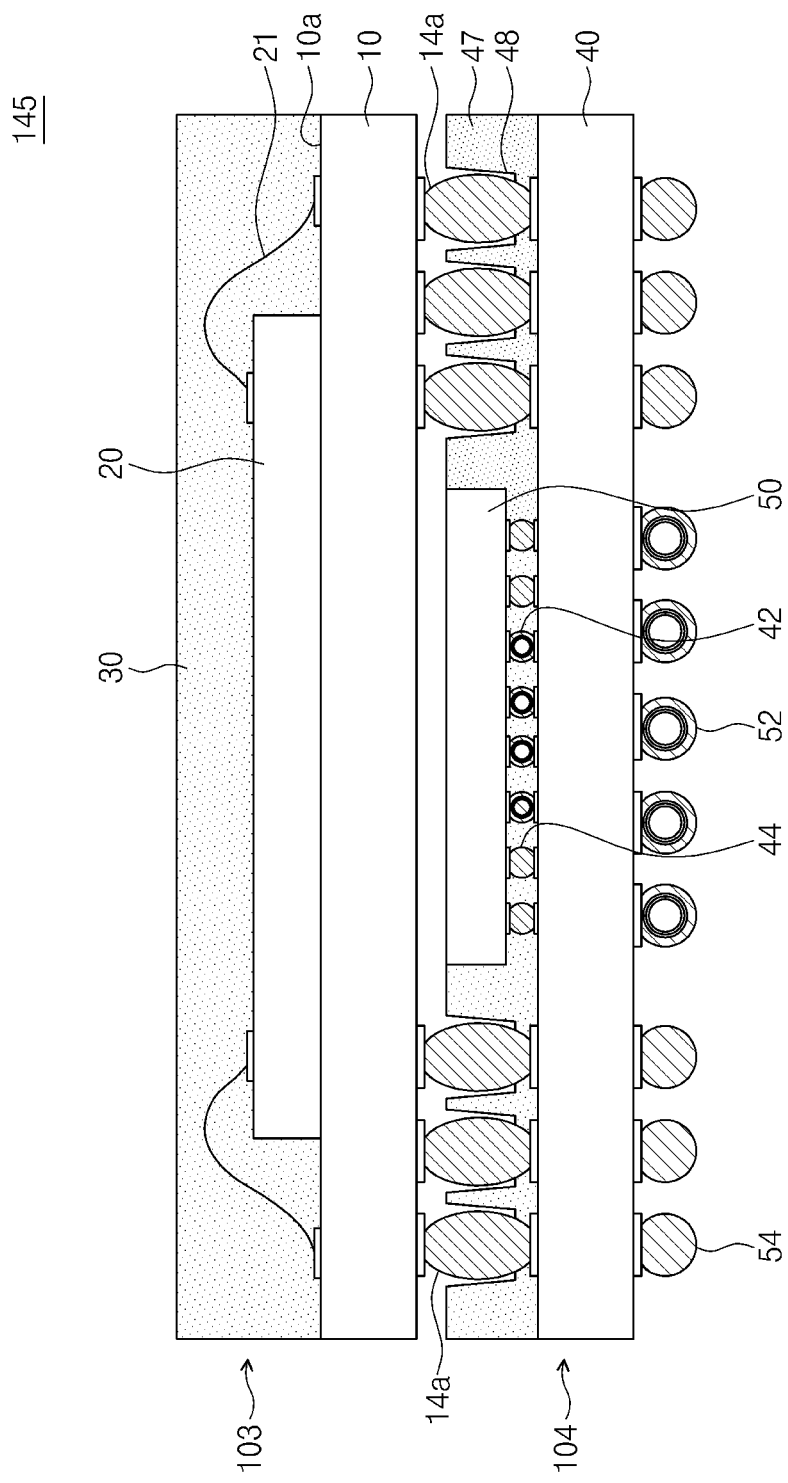

FIGS. 9A and 9B are cross sectional views taken along lines II-II' and III-III' of FIG. 7, respectively, to illustrate a semiconductor package according to a fourth embodiment of the present general inventive concept.

Referring to FIGS. 9A and 9B, a semiconductor package 145 according to the fourth embodiment may have a package-on-package structure including a first sub semiconductor package 103 and a second sub semiconductor package 104 disposed below the first sub semiconductor package 103. The first sub semiconductor package 103 may include a first package substrate 10 and a first semiconductor chip 20 mounted on a top surface 10a of the first package substrate 10. The first semiconductor chip 20 may be electrically connected to the first package substrate 10 through bonding wires 21. The first semiconductor chip 20 on the first package substrate 10 may be encapsulated with a first mold layer 30. The second sub semiconductor package 104 may include a second package substrate 40 and a second semiconductor chip 50 mounted on the second package substrate 40. Third central connection members 42 and third peripheral connection members 44 may be disposed between the second package substrate 40 and the second semiconductor chip 50. The second semiconductor chip 50 on the second package substrate 40 may be encapsulated with a second mold layer 47. Fourth central connection members 52 and fourth peripheral connection members 54 may be disposed on a bottom surface of the second package substrate 40 opposite to the second semiconductor chip 50. First central connection members 12a and first peripheral connection members 14a may be disposed between the first package substrate 10 and the second package substrate 40. A plurality of holes 48 may penetrate the second mold layer 47 to expose portions of a top surface of the second package substrate 40. The first connection members 12a and 14a may be disposed in the holes 48 to electrically connect the first package substrate 10 to the second package substrate 40. The first connection members 12a and 14a may have an oval-shaped sectional view, and the first connection members 12a and 14a may be disposed so that major axes of the first connection members 12a and 14a having the oval-shaped sectional view may be perpendicular to a top surface of the second package substrate 40. Each of the first central connection members 12a may include a supporter therein. A top surface of the second mold layer 47 may be coplanar with a top surface of the second semiconductor chip 50. Other configurations except the above descriptions may be similar to or the same as those described in the third embodiment of the present general inventive concept.

Figure 10:
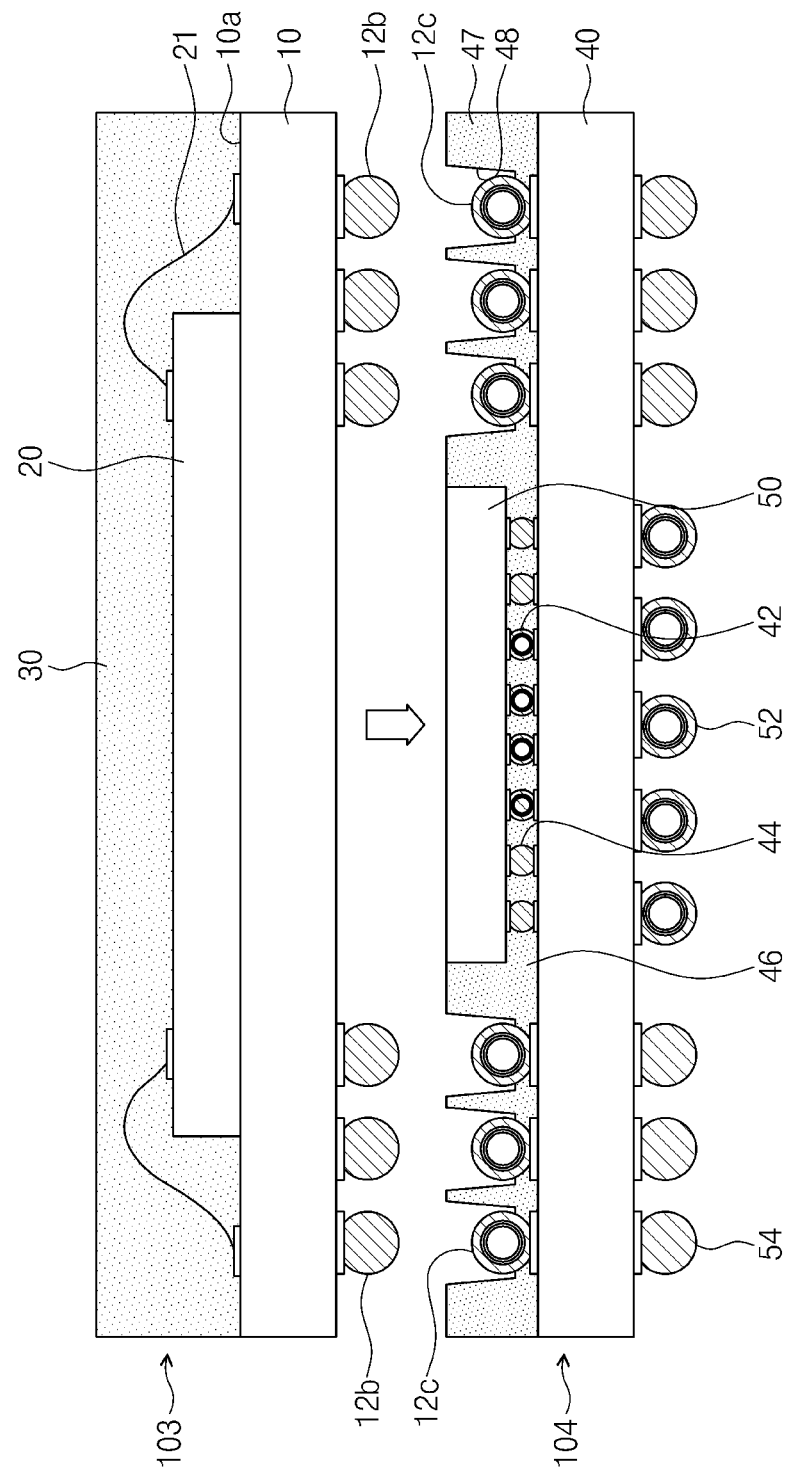
FIG. 10 is a cross sectional view illustrating a method of fabricating a semiconductor package of FIG. 9A.

FIG. 10 is a cross sectional view illustrating a method of fabricating a semiconductor package illustrated in FIG. 9A.

Referring to FIG. 10, the first sub semiconductor package 103 may be mounted on the second sub semiconductor package 104. First sub central connection members 12b may be disposed in the pair of horizontal center portions XC and the pair of vertical center portions YC of the bottom surface of the first package substrate 10 of the first sub semiconductor package 103. The first sub central connection members 12b may not include the supporter therein, like the fourth peripheral connection members 54. In fabrication of the second sub semiconductor package 104, second sub central connection members 12c may be disposed in the holes 48 penetrating the second mold layer 47. The second sub central connection members 12c include the supporter therein. The first sub semiconductor package 103 may be disposed on the second sub semiconductor package 104 so that the first sub central connection members 12b are inserted into the holes 48 to contact the second sub central connection members 12c, and the first and second sub semiconductor packages 103 and 104 may be then heated up to melt the fusion conductive layers of the first and second sub central connection members 12b and 12c for a predetermined time. Consequently, the first and second sub central connection members 12b and 12c may be physically combined with each other to form the first central connection members 12a having the oval-shaped sectional view illustrated in FIG. 9A.

Figure 11:
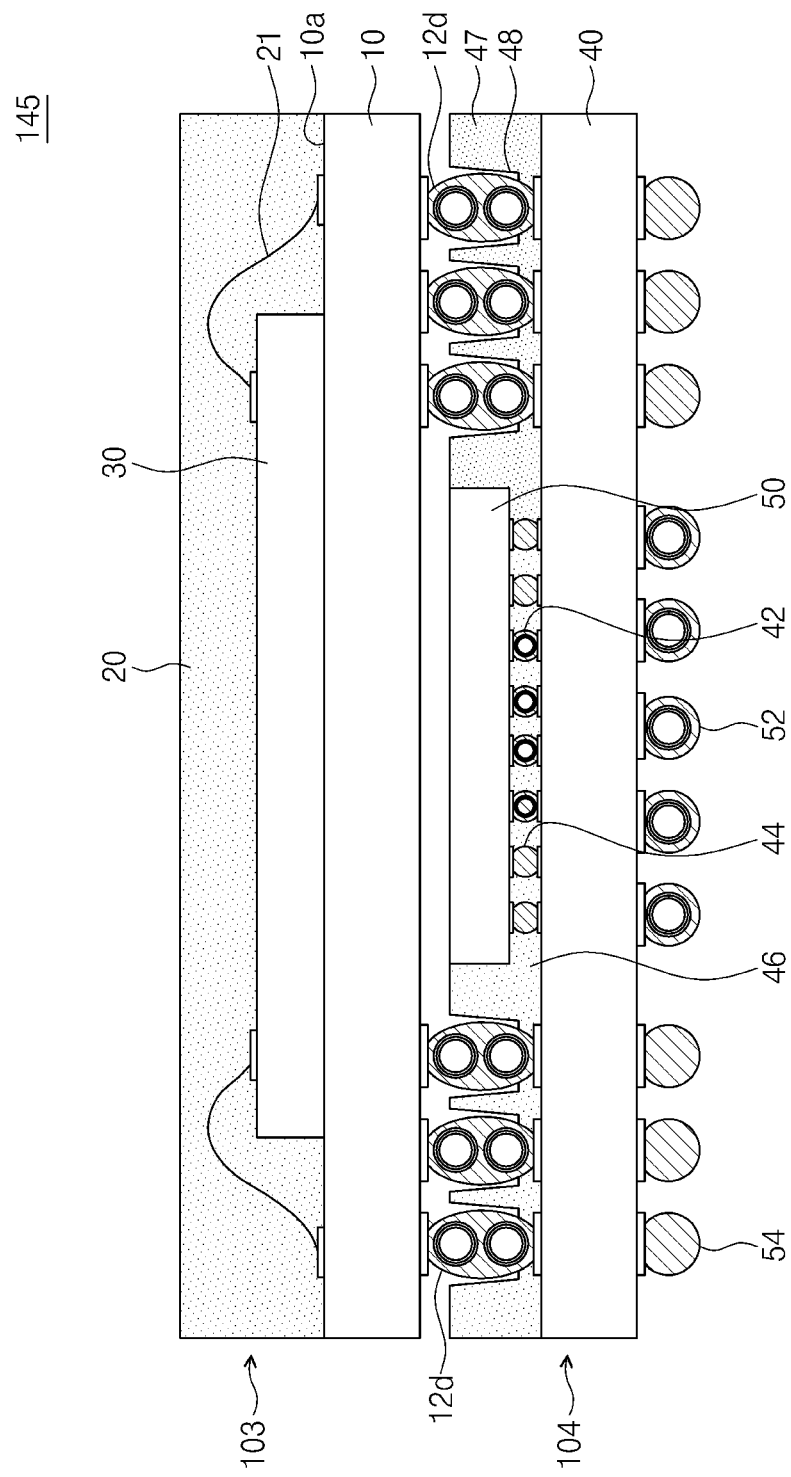
FIG. 11 is a cross sectional view taken along a line II-II' of FIG. 7 to illustrate a modified embodiment of a semiconductor package according to a fourth embodiment of the present general inventive concept.

FIG. 11 is a cross sectional view taken along a line II-II' of FIG. 7 to illustrate a modified embodiment of a semiconductor package according to a fourth embodiment of the present general inventive concept.

Referring to FIG. 11, each of the first sub central connection members 12b illustrated in FIG. 10 may include a supporter, such as the second sub central connection members 12c illustrated in FIG. 10. In this case, the first and second sub central connection members 12b and 12c may be physically combined with each other to form first central connection members 12d. That is, each of the first central connection members 12d may include a pair of supporters sequentially stacked therein, as illustrated in FIG. 11.

Figure 12:
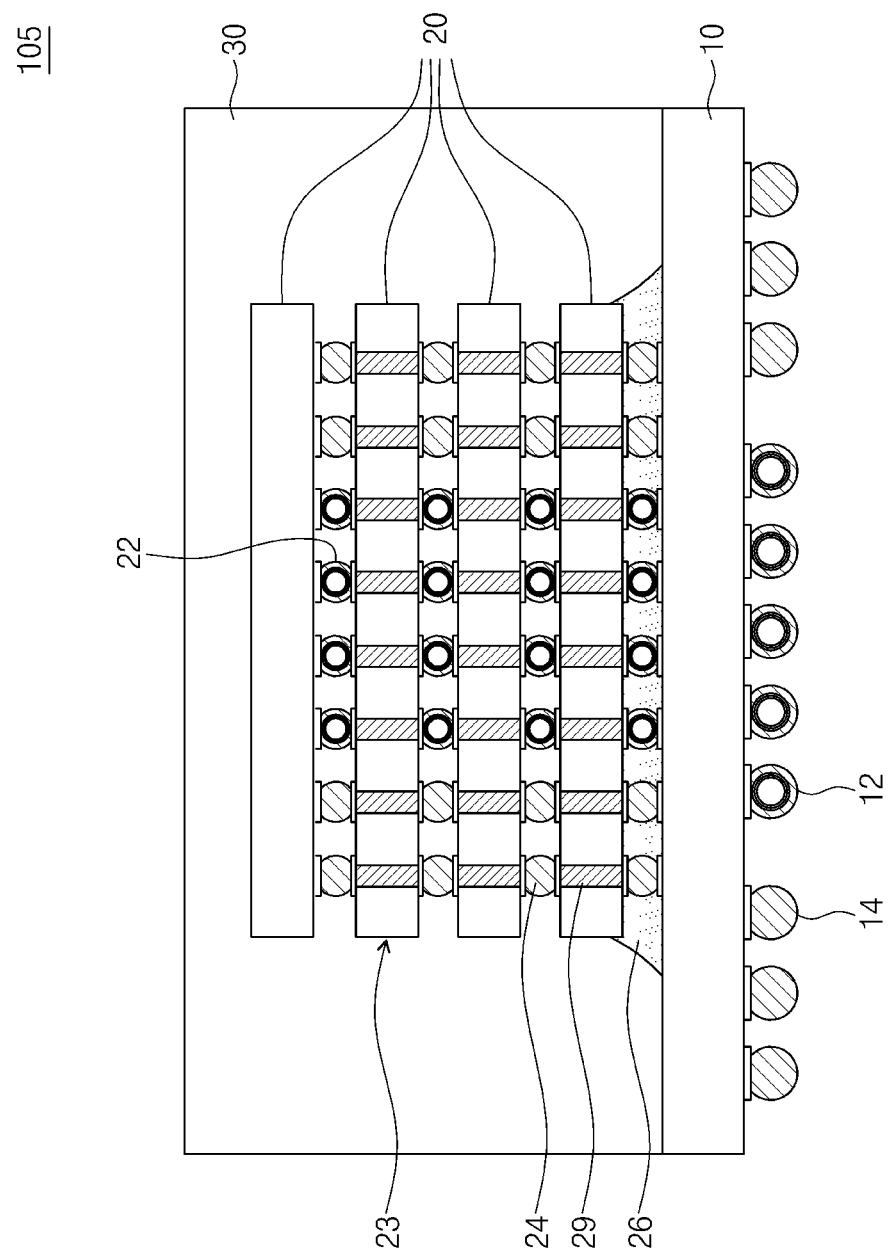
FIG. 12 is a cross sectional view illustrating a semiconductor package according to a fifth embodiment of the present general inventive concept.

FIG. 12 is a cross sectional view illustrating a semiconductor package according to a fifth embodiment of the present general inventive concept.

Referring to FIG. 12, a semiconductor package 105 according to the fifth embodiment of the present general inventive concept may include a package substrate 10 and a semiconductor chip stack 23 that includes a plurality of semiconductor chips 20 stacked on the package substrate 10. At least one of the semiconductor chips 20 may include a plurality of through silicon via (TSV) electrodes 29 passing therethrough. Second connection members 22 and 24 may be disposed between the lowermost semiconductor chip 20 of the semiconductor chips 20 and the package substrate 10 as well as between the semiconductor chips 20, thereby electrically connecting the package substrate 10 to the semiconductor chips 20. Other configurations except the above descriptions may be similar to or the same as those described in the first embodiment of the present general inventive concept.

In the event that the plurality of semiconductor chips 20 are stacked on the package substrate 10 as described above, a physical stress and/or a thermal stress may be more concentrated at a central portion of the package substrate 10. Thus, when first connection members 12 and 14 are attached to the package substrate 10 and a mother board, there may be a high probability that the package substrate 10 is more severely warped to have a concave shape. However, according to the present embodiment, each of the first central connection members 12 includes the supporter. Therefore, the supporters in the first central connection members 12 may prevent the package substrate 10 from being warped to have a concave shape even though the plurality of semiconductor chips 20 are stacked on the package substrate 10.

Figure 13:
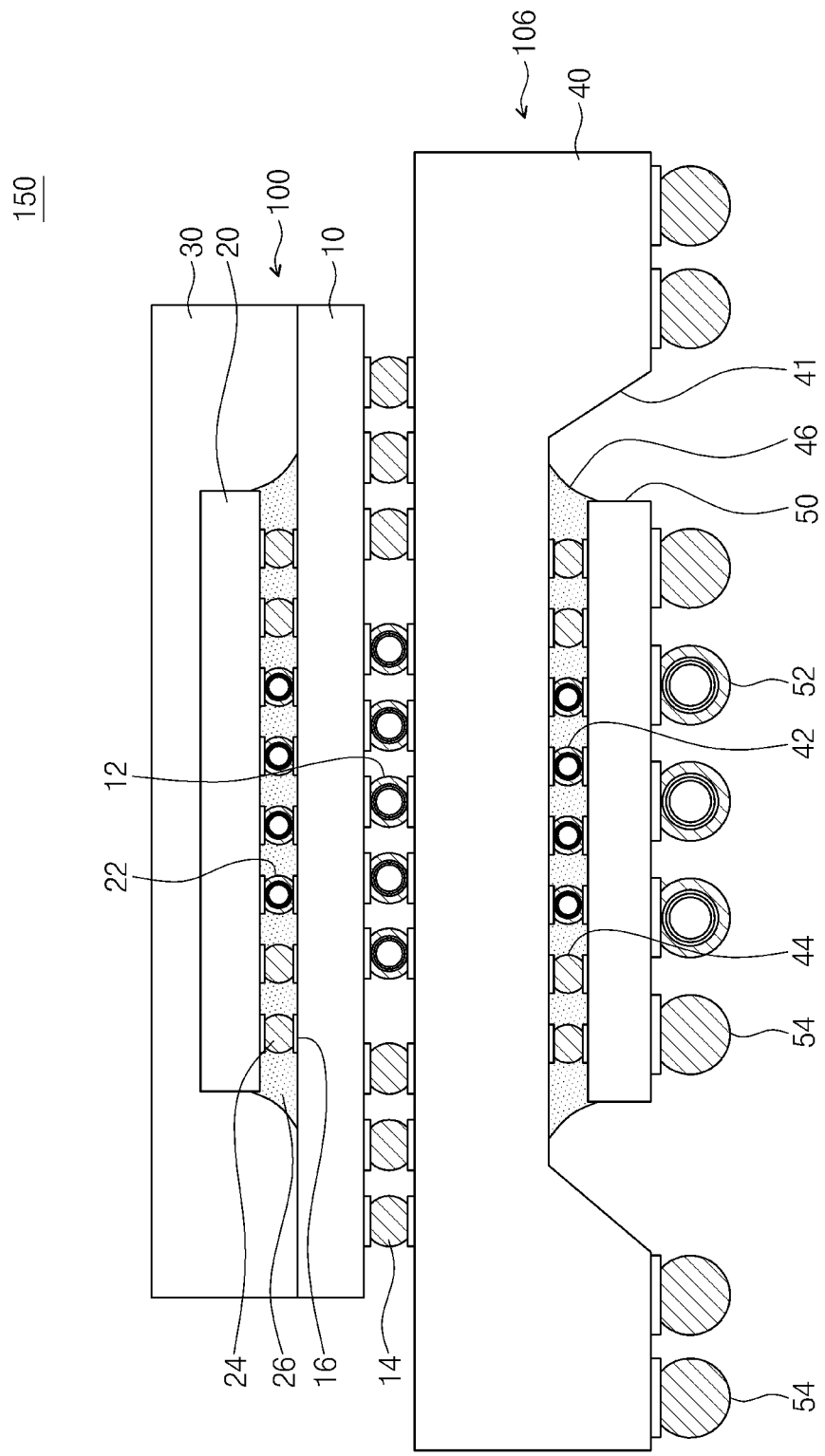
FIG. 13 is a cross sectional view illustrating a semiconductor package according to a sixth embodiment of the present general inventive concept.

FIG. 13 is a cross sectional view illustrating a semiconductor package according to a sixth embodiment of the present general inventive concept.

Referring to FIG. 13, a semiconductor package 150 according to the sixth embodiment of the present general inventive concept may have a package-on-package structure. That is, the semiconductor package 150 may include a first sub semiconductor package 100 and a second sub semiconductor package 106 disposed below the first sub semiconductor package 100. The first sub semiconductor package 100 may include a first package substrate 10 and a first semiconductor chip 20 mounted on the first package substrate 10, and the second sub semiconductor package 106 may include a second package substrate 40 and a second semiconductor chip 50 mounted on the second package substrate 40. The first sub semiconductor package 100 may correspond to the semiconductor package 100 having the cross sectional view of FIG. 2. The second package substrate 40 may include a bottom surface defining a recessed region 41. The second semiconductor chip 50 may be mounted in the recessed region 41 defined by the bottom surface of the second package substrate 40. A space region between the second semiconductor chip 50 and the second package substrate 40 may be filled with an under fill resin layer 46. Third connection members may be disposed between the second package substrate 40 and the second semiconductor chip 50, thereby electrically connecting the second semiconductor chip 50 to the second package substrate 40. The third connection members may include third central connection members 42 disposed on a central portion of the second semiconductor chip 50 and third peripheral connection members 44 disposed on a peripheral portion of the second semiconductor chip 50. The third central connection members 42 may correspond to the second central connection members 22 described in the first embodiment. That is, each of the third central connection members 42 may include a supporter therein. The third peripheral connection members 44 may correspond to the second peripheral connection members 24 described in the first embodiment. Fourth central connection members 52 may be attached to a central portion of a bottom surface of the second semiconductor chip 50. Further, fourth peripheral connection members 54 may be attached to a peripheral portion of the bottom surface of the second semiconductor chip 50 and to a peripheral portion of the bottom surface of the second package substrate 40. In the semiconductor package 150 according to the sixth embodiment, it may be important to control distances between the semiconductor chips 20 and 50 and the package substrates 10 and 40. Thus, in the present embodiment, it may be preferable to employ the central connection members 12, 22, 42 and 52 including the supporters. Consequently, a high reliable package-on-package structure may be realized.

The semiconductor package techniques described above may be applicable to diverse semiconductor devices and various package modules including the same.

Figure 14:
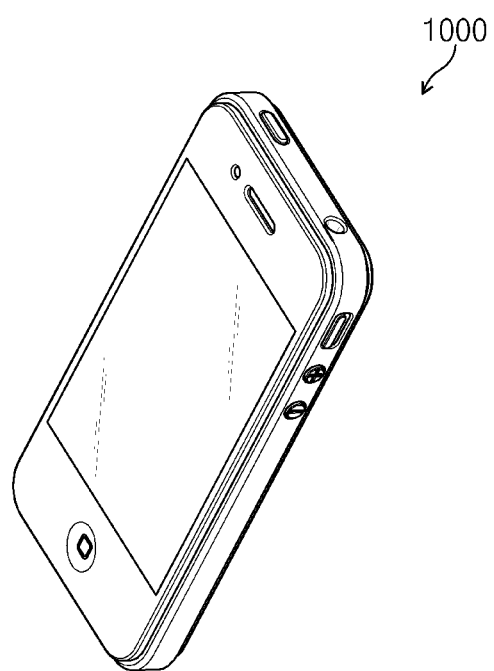
FIG. 14 is a perspective view illustrating an electronic system including at least one of the semiconductor packages according to embodiments of the present general inventive concept.

FIG. 14 is a perspective view illustrating an electronic system including at least one of semiconductor packages according to embodiments of the present general inventive concept.

Referring to FIG. 14, semiconductor packages according to the embodiments of the present general inventive concept may be applicable to an electronic system 1000, for example, a smart phone. The semiconductor packages according to the embodiments of the present general inventive concept may have the advantages which are capable of scaling down and/or realizing high performance. The electronic system including the semiconductor packages according to the embodiments is not limited to the smart phone. For example, the semiconductor packages according to the embodiments may be applicable to a mobile electronic product, a laptop computer, a portable computer, a portable multimedia player (PMP), an MP3 player, a camcorder, a web tablet, a wireless phone, a navigator or a personal digital assistant (PDA).

Figure 15:
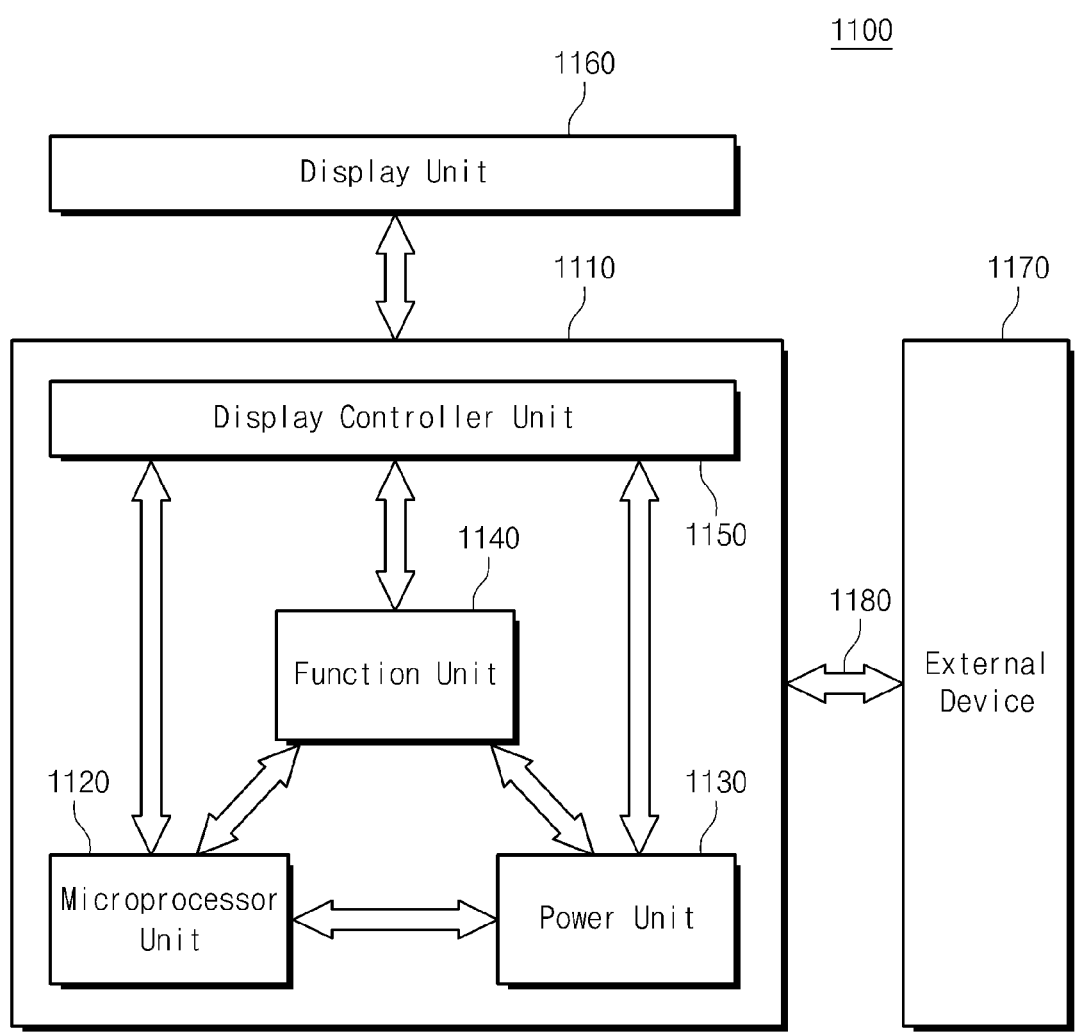
FIG. 15 is a schematic block diagram illustrating an electronic system including at least one of semiconductor packages according to embodiments of the present general inventive concept.

FIG. 15 is a schematic block diagram illustrating an electronic system including at least one of the semiconductor packages according to embodiments of the present general inventive concept.

Referring to FIG. 15, the semiconductor package 100, 105, 140, 145 or 150 described above may be applicable to an electronic system 1100. The electronic system 1100 may include a body 1110, a microprocessor unit 1120, a power unit 1130, a function unit 1140 and a display control unit 1150. The body 1110 may include a set board formed of a printed circuit board (PCB), and the microprocessor unit 1120, the power unit 1130, the function unit 1140 and the display control unit 1150 may be mounted on and/or in the body 1110.

The power unit 1130 may receive an electric power having a certain voltage from an external battery and may generate a plurality of output power signals having different voltages, and the output power signals may be supplied to the microprocessor unit 1120, the function unit 1140 and the display control unit 1150.

The microprocessor unit 1120 may receive one of the output power signals from the power unit 1130 to control the function unit 1140 and the display unit 1160. The function unit 1140 may operate so that the electronic system 1100 executes one of diverse functions. For example, in the event that the electronic system 1100 is a mobile phone, the function unit 1140 may include various components which are capable of executing functions of the mobile phone, for example, a function of dialing, a function of outputting image signals to the display unit 1160 during communication with an external device 1170, and a function of outputting audio signals to speakers during communication with an external device 1170. Further, when the electronic system 1100 includes a camera, the function unit 1140 may correspond to a camera image processor CIP. Moreover, if the electronic system 1100 is connected to a memory card to increase a memory capacity, the function unit 1140 may correspond to a memory card controller. The function unit 1140 may communicate with the external device 1170 through a communication unit 1180 by wireless or cable. Furthermore, in the event that the electronic system 1100 needs a universal serial bus (USB) to expand function, the function unit 1140 may be an interface controller. The semiconductor package 100, 105, 140, 145 or 150 described above may be used in at least one of the microprocessor unit 1120 and the function unit 1140.

Figure 16:
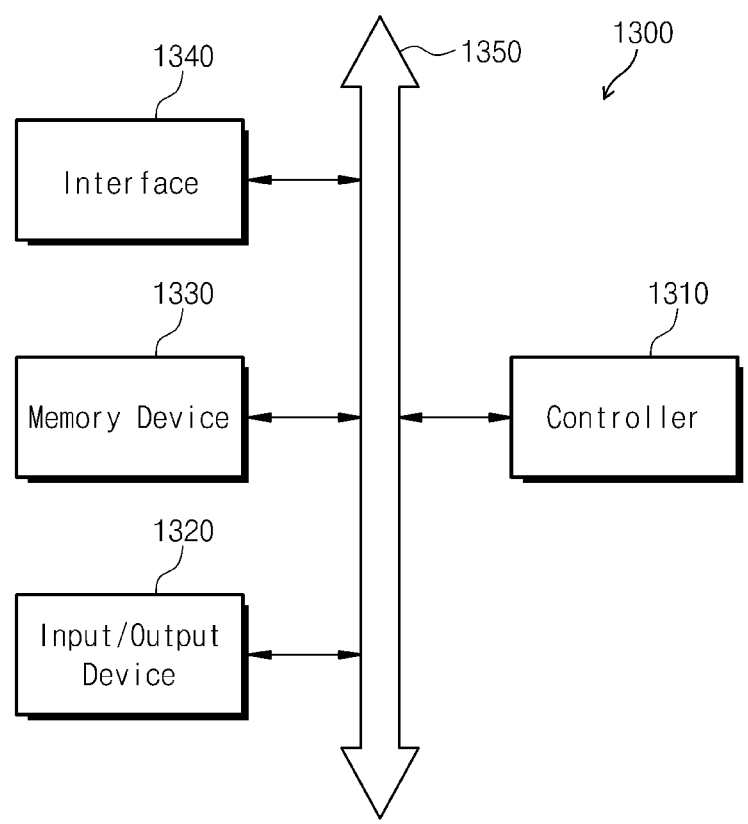
FIG. 16 is a block diagram illustrating an example of electronic systems including semiconductor packages according to embodiments of the present general inventive concept.

FIG. 16 is a block diagram illustrating an example of electronic systems including semiconductor packages according to the embodiments of the present general inventive concept.

Referring to FIG. 16, an electronic system 1300 according to an embodiment of the present general inventive concept may include a controller 1310, an input/output (I/O) device 1320, a memory device 1330 and a data bus 1350. At least two of the controller 1310, the I/O device 1320 and the memory device 1330 may communicate with each other through the data bus 1350. The data bus 1350 may correspond to a path through which electrical signals are transmitted.

The controller 1310 may include at least one of a microprocessor, a digital signal processor, a microcontroller and a logic device. The logic device may have a similar function to any one of the microprocessor, the digital signal processor and the microcontroller. The controller 1310 and/or the memory device 1330 may include at least one of the semiconductor packages described in the above embodiments. The I/O device 1320 may include at least one of a keypad, a keyboard and a display device. The memory device 1330 may store data and/or commands executed by the controller 1310. The memory device 1330 may include a volatile memory device and/or a nonvolatile memory device. For example, the memory device 1330 may include a flash memory device to which the package techniques according to the embodiments are applied. That is, the flash memory device according to the embodiments of the present general inventive concept may be mounted in an information processing system such as a mobile device or a desk top computer. The flash memory device may constitute a solid state disk (SSD). In this case, the solid state disk including the flash memory device may stably store a large capacity of data. The electronic system 1300 may further include an interface unit 1340. The interface unit 1340 may transmit data to a communication network or may receive data from a communication network. The interface unit 1340 may operate by wireless or cable. For example, the interface unit 1340 may include wireless communication antenna or a cable communication transceiver. The electronic system 1300 may further include an application chipset and/or a camera image processor.

According to the exemplary embodiments set forth above, connection members including a supporter are attached to a central portion of a substrate used in a semiconductor package. Thus, the connection members having the supporter can prevent the substrate from being warped even though the substrate is heated to a high temperature during a surface mounting process. That is, an electrical shortage between the adjacent connection members (corresponding to solder balls) may be prevented to enhance the yield of the semiconductor packages and to reduce the failure rate of the semiconductor package process.

Although a few exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:
1. A semiconductor package comprising:
a first substrate;
a first semiconductor chip mounted on the first substrate;
a second substrate disposed on the first substrate, the second substrate including a central portion and a peripheral portion around the central portion;
a plurality of first connection members attached to the peripheral portion of the second substrate and configured to electrically connect the first and second substrates; and
a plurality of second connection members attached to the peripheral portion of the second substrate and configured to electrically connect the first and second substrates,
wherein the first semiconductor chip is under the central portion of the second substrate,
wherein only the first connection members are adjacent to a side of the central portion,
wherein only the second connection members are adjacent to a vertex of the central portion,
wherein each of the first connection members includes a first supporter and a first fusion conductive layer surrounding the first supporter, and
wherein each of the second connection members consists of a uniform conductive material.

2. The semiconductor package of claim 1, wherein the central portion is disposed in a central area of a surface of the second substrate, and
wherein the peripheral portion is disposed in a peripheral area of the surface of the second substrate around the central area.

3. The semiconductor package of claim 1, wherein the peripheral portion includes a center region and a corner region, the center region being adjacent to a central point of a side of the second substrate,
wherein the first connection members are attached to the center region of the peripheral portion, and
wherein the second connection members are attached to the corner region of the peripheral portion.

4. The semiconductor package of claim 1, wherein each of the second connection members does not include the first supporter.

5. The semiconductor package of claim 1, wherein each of the first connection members further includes a first adhesive layer disposed between the first supporter and the first fusion conductive layer, the first adhesive layer being a diffusion barrier layer to prevent diffusion from the first fusion conductive layer to the first supporter.

6. The semiconductor package of claim 1, wherein each of the first connection members further includes a second supporter.

7. The semiconductor package of claim 1, further comprising:
a plurality of central connection members attached to a central portion of the first semiconductor chip and interposed between the first substrate and the first semiconductor chip; and
a plurality of peripheral connection members attached to a peripheral portion of the first semiconductor chip and interposed between the first substrate and the first semiconductor chip,
wherein each of the central connection members includes a second supporter and a second fusion conductive layer surrounding the second supporter.

8. The semiconductor package of claim 7, wherein a height of the first connection member is different from a height of the central connection member.

9. The semiconductor package of claim 1, further comprising:
a plurality of central connection members attached to a central portion of a first surface of the first substrate; and
a plurality of peripheral connection members attached to a peripheral portion of the first surface of the first substrate,
wherein the first semiconductor chip mounted on a second surface opposite to the first surface, and
wherein each of the central connection members includes a second supporter and a second fusion conductive layer surrounding the second supporter.

10. The semiconductor package of claim 1, further comprising a second semiconductor chip mounted on the second substrate,
wherein the second semiconductor chip is electrically connected to the second substrate through bonding wires.

11. The semiconductor package of claim 1, wherein the first supporter includes a polymer material.

12. The semiconductor package of claim 1, wherein a height of the first connection member is substantially equal to a height of the second connection member.

13. The semiconductor package of claim 1, further comprising a mold layer encapsulating the first substrate and filling a space between the first substrate and the first semiconductor chip,
wherein a height of the first connection member is higher than a thickness of the mold layer.

14. The semiconductor package of claim 13, wherein a plurality of holes penetrate the mold layer, and
wherein the first and second connection members are inserted into the holes.

15. A semiconductor package comprising:
a first substrate;
a first semiconductor chip mounted on the first substrate;
a second substrate disposed on the first substrate, the second substrate including a central portion;
a plurality of first connection members attached to a first region of the central portion of the second substrate and configured to electrically connect the first and second substrates; and
a plurality of second connection members attached to at least one of the peripheral portions of the second substrate and configured to electrically connect the first and second substrates,
wherein a cross shaped region is formed that consists of only the first connection members and the central region, and wherein all of the second connection members are located at peripheral portions around and outside of the cross shaped region,
wherein the first semiconductor chip is under a second region of the central portion of the second substrate,
wherein each of the first connection members includes a first supporter and a first fusion conductive layer surrounding the first supporter, and
wherein each of the second connection members consists of a uniform conductive material.

16. The semiconductor package of claim 15, wherein the first and second connection members are spaced apart from the second region of the central portion of the second substrate.

17. A semiconductor package comprising:
a first sub semiconductor package including a first substrate and a first semiconductor chip mounted on a top surface of the first substrate;
a second sub semiconductor package on the first sub semiconductor package, the second sub semiconductor package including a second substrate and a second semiconductor chip mounted on a top surface of the second substrate;
a plurality of central connection members attached to a central portion of the first semiconductor chip and configured to electrically connect the first substrate and the first semiconductor chip, each of the central connection members includes a first supporter and fusion conductive layer surrounding the first supporter;
a plurality of peripheral connection members attached to a peripheral portion of the first semiconductor chip and configured to electrically connect the first substrate and the first semiconductor chip, each of the plurality of peripheral connection members consisting of a uniform conductive material;
a plurality of first connection members attached to a peripheral portion of the second substrate and configured to electrically connect the first and second substrates, each of the first connection members including a second supporter and a second fusion conductive layer surrounding the second supporter; and
a plurality of second connection members attached to the peripheral portion of the second substrate and configured to electrically connect the first and second substrates, each of the second connection members consisting of a uniform conductive material,
wherein the first semiconductor chip is under a central portion of the second substrate,
wherein only the first connection members are adjacent to a side of the central portion of the second substrate,
wherein only the second connection members are adjacent to a vertex of the central portion of the second substrate, and
wherein a height of the first connection member is higher than a height of the central connection member.

18. The semiconductor package of claim 17, wherein the central portion of the second substrate is disposed in a central area of a bottom surface of the second substrate, and wherein the peripheral portion of the second substrate is disposed in a peripheral area of the bottom surface of the second substrate around the central area.

19. The semiconductor package of claim 17, wherein the first connection members are spaced apart from the central portion of the second substrate.

* * * * *